(12) United States Patent
Tanahashi et al.

(10) Patent No.: US 10,071,699 B2
(45) Date of Patent: Sep. 11, 2018

(54) VEHICLE

(71) Applicant: TOYOTA JIDOSHA KABUSHIKI KAISHA, Toyota-shi, Aichi-ken (JP)

(72) Inventors: Toshio Tanahashi, Susono (JP); Yoji Kanehara, Nagoya (JP); Koshi Yamada, Odawara (JP); Yuta Oshiro, Shizuoka-ken (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 14/993,575

(22) Filed: Jan. 12, 2016

(65) Prior Publication Data
US 2016/0200270 A1   Jul. 14, 2016

(30) Foreign Application Priority Data

Jan. 13, 2015 (JP) ................................. 2015-004288

(51) Int. Cl.
*B60R 16/06* (2006.01)
*H02P 23/28* (2016.01)
(Continued)

(52) U.S. Cl.
CPC .............. *B60R 16/06* (2013.01); *B60L 1/003* (2013.01); *B60L 3/003* (2013.01); *B60L 3/0046* (2013.01);
(Continued)

(58) Field of Classification Search
CPC ......... B60R 16/06; H02P 23/28; H05K 7/143; B60L 11/18
(Continued)

(56) References Cited

U.S. PATENT DOCUMENTS 3,597,668 A   8/1971   Yoshimine
3,922,214 A   11/1975  Van Cakenberghe
(Continued)

FOREIGN PATENT DOCUMENTS

JP   S50-26778 A    3/1975
JP   62-156395 A    7/1987
(Continued)

OTHER PUBLICATIONS

Office Action issued in U.S. Appl. No. 15/018,085 dated Dec. 14, 2016.
(Continued)

*Primary Examiner* — Kawing Chan
(74) *Attorney, Agent, or Firm* — Hunton Andrews Kurth LLP

(57) ABSTRACT

A vehicle includes a power control unit having at least one of an inverter and a converter, a drive motor that produces torque for running the vehicle when electric power is supplied from the power control unit to the drive motor, a vehicle body kept insulated from a road surface, a case main body in which the power control unit is housed, a member that is connected to the case main body where the member is insulated from the case main body, or in a condition in which electric resistance is large, and a static eliminator that neutralizes and eliminates positive charges on the member and lowers a positive potential of the member, by self-discharge for producing negative air ions in outside air according to the positive potential of the member that is electrostatically charged.

10 Claims, 6 Drawing Sheets

(51) Int. Cl.
| | |
|---|---|
| *B60L 11/18* | (2006.01) |
| *H02P 31/00* | (2006.01) |
| *B60L 3/00* | (2006.01) |
| *B60L 15/00* | (2006.01) |
| *H05K 9/00* | (2006.01) |
| *H05K 7/14* | (2006.01) |
| *B60L 1/00* | (2006.01) |
| *B60L 7/14* | (2006.01) |
| *B60L 15/20* | (2006.01) |
| *H02P 27/06* | (2006.01) |
| *H02M 7/00* | (2006.01) |

(52) U.S. Cl.
CPC ........... *B60L 3/0069* (2013.01); *B60L 3/0084* (2013.01); *B60L 7/14* (2013.01); *B60L 11/1803* (2013.01); *B60L 11/1851* (2013.01); *B60L 11/1859* (2013.01); *B60L 11/1861* (2013.01); *B60L 11/1864* (2013.01); *B60L 11/1874* (2013.01); *B60L 11/1877* (2013.01); *B60L 11/1879* (2013.01); *B60L 15/007* (2013.01); *B60L 15/20* (2013.01); *B60L 15/2009* (2013.01); *H02P 23/28* (2016.02); *H02P 31/00* (2013.01); *H05K 7/1432* (2013.01); *H05K 9/0067* (2013.01); *B60L 2220/14* (2013.01); *B60L 2240/34* (2013.01); *B60L 2240/36* (2013.01); *B60L 2240/421* (2013.01); *B60L 2240/423* (2013.01); *B60L 2270/145* (2013.01); *H02M 7/003* (2013.01); *H02P 27/06* (2013.01); *Y02T 10/644* (2013.01); *Y02T 10/645* (2013.01); *Y02T 10/7005* (2013.01); *Y02T 10/7044* (2013.01); *Y02T 10/7061* (2013.01); *Y02T 10/7275* (2013.01)

(58) Field of Classification Search
USPC .................................................. 318/503, 494
See application file for complete search history.

(56) References Cited

U.S. PATENT DOCUMENTS

| | | | |
|---|---|---|---|
| 4,795,935 A | 1/1989 | Fujii et al. | |
| 5,095,400 A | 3/1992 | Saito | |
| 5,116,697 A * | 5/1992 | Fleischmann | H01M 2/1247 29/623.1 |
| 5,382,359 A | 1/1995 | Brandt | |
| 5,510,658 A * | 4/1996 | Nakayama | B60L 3/00 180/65.1 |
| 6,008,978 A * | 12/1999 | Tateyama | H01L 21/67173 361/212 |
| 6,235,385 B1 | 5/2001 | Lee | |
| 7,151,988 B2 * | 12/2006 | Sasaki | H01T 23/00 361/216 |
| 7,248,454 B2 | 7/2007 | Takayanagi | |
| 7,684,169 B1 | 3/2010 | Larkin | |
| 7,832,528 B1 | 11/2010 | Liang | |
| 7,971,689 B2 | 7/2011 | Moore | |
| 8,503,154 B2 | 8/2013 | Nakai | |
| 8,681,470 B2 * | 3/2014 | Gorczyca | H01T 23/00 250/251 |
| 9,044,916 B2 | 6/2015 | Koike et al. | |
| 2002/0179311 A1 | 12/2002 | Alper | |
| 2003/0183465 A1 | 10/2003 | Ikeda | |
| 2004/0196611 A1 | 10/2004 | Koenig et al. | |
| 2005/0174718 A1 * | 8/2005 | Fujita | H05F 3/04 361/220 |
| 2006/0187597 A1 | 8/2006 | Onezawa et al. | |
| 2008/0036241 A1 | 2/2008 | Aisenbrey | |
| 2012/0039012 A1 | 2/2012 | Nakai | |
| 2012/0092805 A1 * | 4/2012 | Chen | G06F 1/20 361/231 |
| 2012/0181827 A1 * | 7/2012 | Aoki | B60K 1/04 297/217.3 |
| 2012/0235631 A1 * | 9/2012 | Nakashima | H01M 14/005 320/107 |
| 2012/0300522 A1 | 11/2012 | Tokuyama et al. | |
| 2014/0247554 A1 * | 9/2014 | Sharma | H05K 7/1432 361/695 |
| 2016/0059838 A1 | 3/2016 | Yamada et al. | |
| 2016/0108868 A1 | 4/2016 | Tanahashi et al. | |
| 2016/0177811 A1 | 6/2016 | Tanahashi et al. | |
| 2016/0186639 A1 | 6/2016 | Tanahashi et al. | |
| 2016/0186703 A1 | 6/2016 | Tanahashi et al. | |
| 2016/0208748 A1 | 7/2016 | Tanahashi et al. | |
| 2016/0214453 A1 | 7/2016 | Tanahashi et al. | |
| 2016/0223024 A1 | 8/2016 | Tanahashi et al. | |
| 2016/0230824 A1 | 8/2016 | Tanahashi et al. | |
| 2016/0280162 A1 | 9/2016 | Yamada et al. | |

FOREIGN PATENT DOCUMENTS

| | | | |
|---|---|---|---|
| JP | 62-223390 A | 10/1987 | |
| JP | H01-268160 A | 10/1989 | |
| JP | 04-040800 U1 | 4/1992 | |
| JP | H05-238438 A | 9/1993 | |
| JP | 2001-355524 A | 12/2001 | |
| JP | 2002-104106 A | 4/2002 | |
| JP | 2006-234093 A | 9/2006 | |
| JP | 2008-181694 A | 8/2008 | |
| JP | 2010-177128 A | 8/2010 | |
| JP | 2010-192177 A | 9/2010 | |
| JP | 2010-260391 A | 11/2010 | |
| JP | WO 2015064195 A1 * | 5/2015 | ............ B62D 35/00 |

OTHER PUBLICATIONS

U.S. Patent and Trademark Office, Final Office Action issued in U.S. Appl. No. 15/018,085, dated Jun. 7, 2017, 14 pages.
U.S. Patent and Trademark Office, Corrected Notice of Allowability dated Dec. 14, 2017 in U.S. Appl. No. 15/018,085, 4 pages.
U.S. Patent and Trademark Office, Corrected Notice of Allowability dated Jan. 9, 2018 in U.S. Appl. No. 15/018,085, 4 pages.
U.S. Patent and Trademark Office, Corrected Notice of Allowability dated Feb. 2, 2018 in U.S. Appl. No. 15/018,085, 4 pages.
U.S. Patent and Trademark Office, Notice of Allowance issued to U.S. Appl. No. 15/018,085 dated Oct. 20, 2017, 18 pages.

* cited by examiner

VEHICLE

INCORPORATION BY REFERENCE

The disclosure of Japanese Patent Application No. 2015-004288 filed on Jan. 13, 2015 including the specification, drawings and abstract is incorporated herein by reference in its entirety.

BACKGROUND OF THE INVENTION

1. Field of the Invention

Embodiments of the present invention relates to a vehicle including a power control unit or a power supply that supplies electric power to a drive motor.

2. Description of Related Art

A battery that supplies electric power to accessories installed on a vehicle is described in Japanese Patent Application Publication No. 2010-177128 (JP 2010-177128 A). A lid of the battery is formed of a resin material. An electrostatic induction member is attached to the lid that causes static charges from a person who contacts the battery to flow to the vehicle body. The electrostatic induction member is attached to such a position that gas accumulated inside the battery, or gas discharged from the battery, is not ignited by a spark produced due to static electricity.

A power module including a power device, such as insulated gate bipolar transistor (IGBT), is described in Japanese Patent Application Publication No. 1-268160 (JP 1-268160 A). In the power module, one of a gate and a source is pressed against the other by elastic force, so that the gate and the source are kept in contact with each other during transportation.

In the meantime, a power supply unit that supplies electric power to a drive motor may give rise to static electricity when it is in operation. Meanwhile, the wheels are usually formed of an insulating material, such as rubber. Accordingly, the power supply unit is electrostatically charged. Thus, the controllability of electric power generated from the power supply unit may be reduced or deteriorated due to an influence of the static electricity.

SUMMARY

Embodiments of the present invention provide a vehicle that can neutralize and eliminate static electricity of a power unit connected to a drive motor.

A first aspect of embodiments of the present invention is concerned with a vehicle. The vehicle includes a power control unit having at least one of an inverter and a converter, a drive motor configured to produce torque for running the vehicle when electric power is supplied from the power control unit to the drive motor, a vehicle body that is kept insulated from a road surface, a case main body in which the power control unit is housed, a member that is connected to the case main body where the member is insulated from the case main body, or where electric resistance is large, and a static eliminator configured to neutralize and eliminate positive charges on the member and lower a positive potential of the member, by self-discharge for producing negative air ions in outside air according to the positive potential of the member that is electrostatically charged.

In the above aspect of the invention, the member may be a lid that closes the case main body, and the static eliminator may be attached to an outer surface of the lid.

In the above aspect of the invention, the member may be formed of a resin material.

In the above aspect of the invention, the static eliminator may be attached to a central portion of the member.

In the above aspect of the invention, the static eliminator may be a sheet formed of a material having electric conductivity.

A second aspect of embodiments of the present invention is concerned with a vehicle. The vehicle includes a power supply of a drive motor, a vehicle body that is kept insulated from a road surface, a fixed frame connected to the vehicle body such that the power supply is mounted on the fixed frame, a cover member connected to the fixed frame such that the power supply is surrounded by the cover member, and a static eliminator configured to neutralize and eliminate positive charges on at least one of a connecting portion between the fixed frame and the vehicle body, and a connecting portion between the fixed frame and the cover member, and lower a positive potential of the above-indicated at least one of the connecting portions, by self-discharge for producing negative air ions in outside air according to the positive potential of the above-indicated at least one of the connecting portions which is electrostatically charged.

In the above aspect of the invention, the cover member and the power supply may be arranged such that air flows between an inner surface of the cover member and the power supply.

In the above aspect of the invention, the static eliminator may be a sheet formed of a material having electric conductivity.

According to the first aspect of the invention, the inverter and the converter are housed in the case main body, and the member connected to the case main body while being insulated therefrom is provided with the self-discharge-type static eliminator that gives rise to negative air ions in outside air according to the positive potential of the member. With the positive potential of the member thus lowered by the self-discharge-type static eliminator, a potential difference between the member and inside air of the case main body increases, so that static charges are transferred from the inside air of the case main body to the member. Then, a potential difference between the inside air and the inverter and converter increases, so that static charges are transferred from the inverter and converter to the inside air. Namely, positive static charges produced when the inverter and converter are started are transferred to the member via the inside air of the case main body, and then neutralized and eliminated by the self-discharge-type static eliminator. Therefore, the inverter and converter are less likely or even unlikely to be electrostatically charged, and the controllability of the inverter and converter is less likely or even unlikely to be influenced by static electricity. As a result, degradation of the running performance of the vehicle, such as variations in the output torque of the drive motor, can be curbed or prevented.

Also, it is possible to eliminate static charges taken by the case main body, by eliminating static electricity of the member. Therefore, static electricity of the inverter and converter housed in the case main body can be eliminated via a contact portion with the case main body. As a result, degradation of the running performance of the vehicle can be further curved, by eliminating static electricity of the inverter and converter via the contact portion with the case main body, in addition to the effect of eliminating static electricity of the inverter and converter via the inside air of the case main body.

Further, according to the second aspect of the invention, the vehicle includes the fixed frame on which the power supply of the drive motor is mounted, and the cover member connected to the fixed frame, and the self-discharge-type static eliminator is provided in the connecting portion between the fixed frame and the vehicle body, or the connecting portion between the fixed frame and the cover member. The static eliminator neutralizes and eliminates positive static charges on the connecting portion so as to lower the positive potential of this portion, by self-discharge for producing negative air ions according to the positive potential of the connecting portion. With the potential of any of the above-indicated connecting portions thus lowered by the self-discharge-type static eliminator, a potential difference between the cover member and its inside air increases, so that static charges are transferred from the inside air to the cover member. Then, a potential difference between the inside air and the power supply increases, so that static charges are transferred from the power supply to the inside air. Namely, positive static charges produced when the power supply is started are transferred to the cover member via the inside air of the cover member, and are neutralized and eliminated by the self-discharge-type static eliminator provided on the connecting portion between the cover member and the fixed frame, or the connecting portion between the fixed frame and the vehicle body. Therefore, the power supply is less likely or even unlikely to be electrostatically charged, and electric power generated from the power supply is less likely or even unlikely to be influenced by the static electricity. As a result, degradation of the running performance of the vehicle, such as variations in the output torque of the drive motor, can be curbed.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Vehicles to which this invention can be applied include a hybrid vehicle having an engine and a motor as drive power sources, or a vehicle including a drive motor (which will be simply referred to as "motor"), for example, an electric vehicle having only the motor as a drive power source. One example of the motor is a three-phase synchronous electric motor configured such that its output torque and rotational speed are controlled according to the magnitude and frequency of a current passed through the motor. The synchronous motor is configured to generate electric power when it is forcibly rotated by external force. In the meantime, wheels are formed of an insulating material (or a material having a small electric conductivity), such as rubber, and the vehicle body and the road surface are held in an insulated condition.

Figure 6:
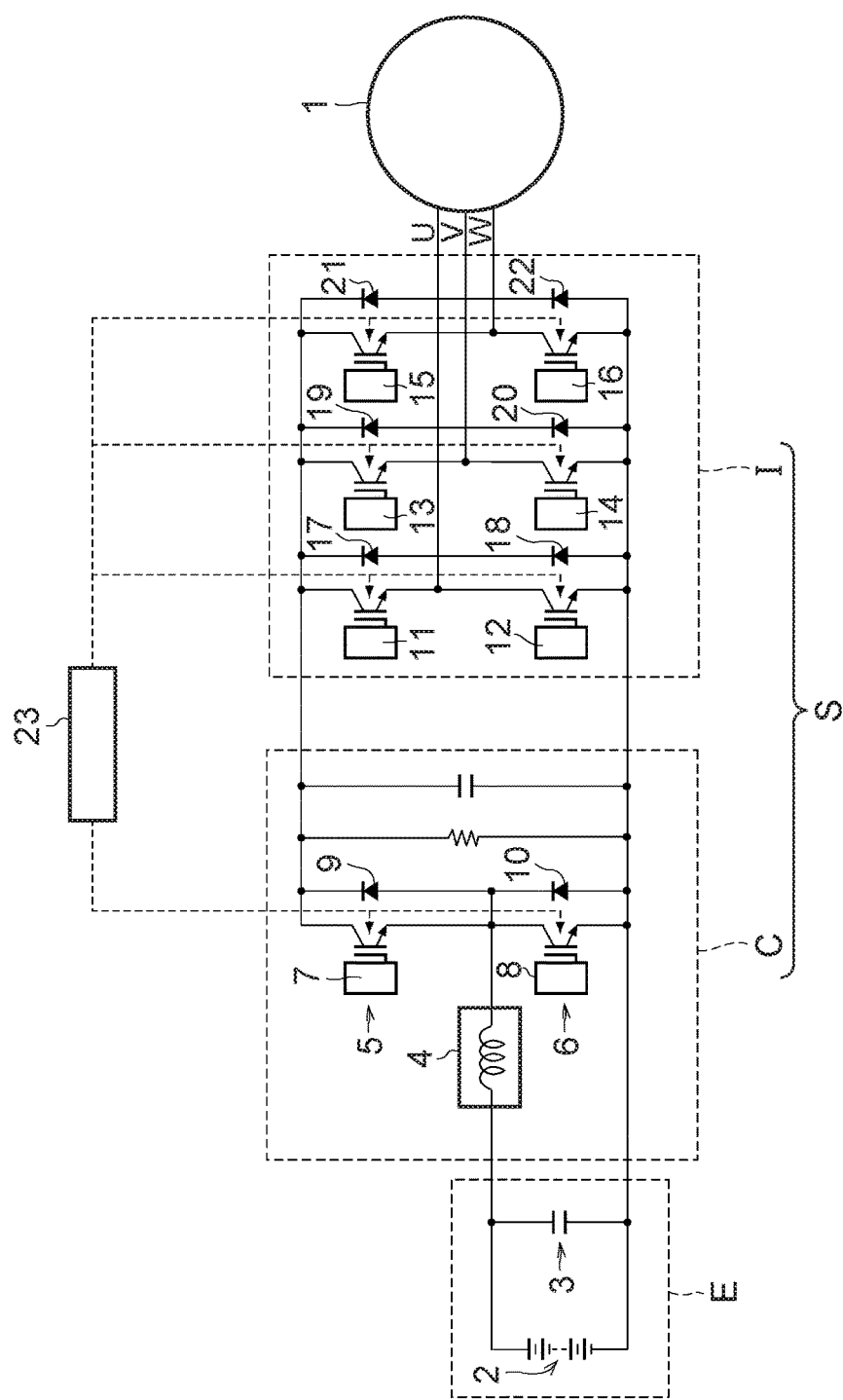
FIG. 6 is an electric circuit diagram useful for explaining the configuration of an electric circuit that supplies electric power to a drive motor.

FIG. 6 shows one example of an electric circuit that supplies electric power to a motor 1. In the example shown in FIG. 6, a battery 2 and a capacitor 3 are provided in parallel with each other, and the battery 2 and capacitor 3 function as a power supply E. A converter C capable of increasing the output voltage of the power supply E is connected to the power supply E. The converter C includes a reactor 4 for suppressing or reducing variations in current, and two switches 5, 6, and one end of the reactor 4 is connected to the positive terminal of the power supply E. The other end of the reactor 4 is connected to a middle point of the two switches 5, 6 connected in series. The switches 5, 6 include insulated gate bipolar transistors (which will be denoted as "IGBT") 7, 8, and diodes 9, 10 that cause current to flow through the IGBTs 7, 8 in one direction. Each of the IGBTs 7, 8 is operable under Pulse-width modulation (PWM) control. When the on-duty of the upper IGBT 7 in FIG. 6 is increased, the voltage on the output side of the converter C (which will be denoted as "inverter input voltage") is reduced. When the on-duty of the lower IGBT 8 in FIG. 6 is increased, the inverter input voltage is increased.

The inverter I is connected to the output side of the converter C. The inverter I includes three parallel circuits, and is operable to convert DC current generated from the power supply E into AC current, or convert AC current of power generated by the motor 1 into DC current. Each of the circuits, which is configured similarly, includes two IGBTs 11, 12, 13, 14, 15, 16, and two diodes 17, 18, 19, 20, 21, 22, and the output current of each circuit is caused to pass through a corresponding one of the U phase, V phase, and W phase of the motor 1. Accordingly, the frequency of current passed through each phase is changed by performing coordinated control on the on-duties of the IGBTs 11, 12, 13, 14, 15, 16, so that the rotational speed of the motor 1 is controlled. An electronic control unit (which will be denoted as "ECU") 23 is connected to each of the IGBTs 7, 8, 11, 12, 13, 14, 15, 16, and is configured to control the IGBTs 7, 8, 11, 12, 13, 14, 15, 16, according to signals detected by sensors (not shown).

Figure 1:
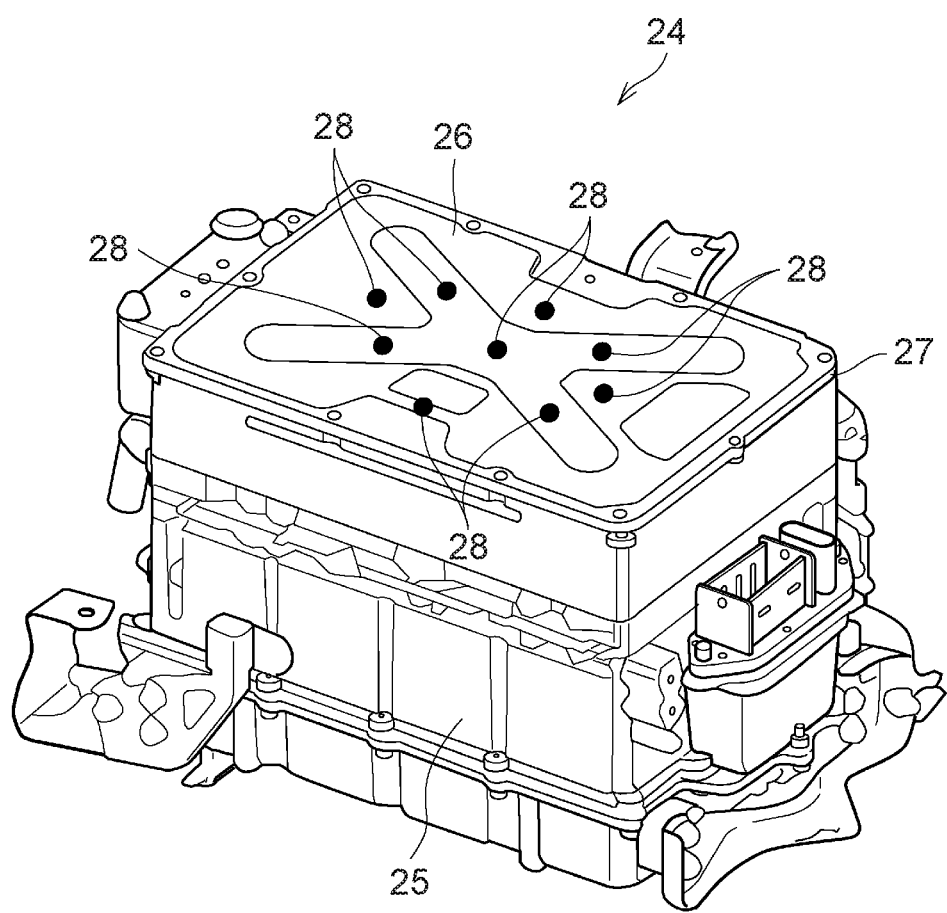
FIG. 1 is a view useful for explaining the arrangement having sheets attached to a case in which an inverter and a converter are housed, in one embodiment of the invention.

FIG. 1 shows one example of a case 24 in which the inverter I and converter C as described above are housed. The case 24 includes a first main body portion 25 that is open upward, and a first lid portion 26 that closes the opening of the first main body portion 25. The inverter I and the converter C are connected to the first main body portion 25 with bolts, or the like, and the first main body portion 25 is fixed to a vehicle body (not shown) with bolts, or the like. The first main body portion 25 and the first lid portion 26 are formed of a metallic material or materials. The first main body portion 25 and the first lid portion 26 are connected to each other with bolts (not shown), such that a seal member 27, such as a rubber ring, is sandwiched between these portions 25, 26. Accordingly, the first lid portion 26, and the first main body portion 25 and the vehicle body, are in an electrically insulated condition, or a condition in which electric resistance is large. Also, the interior of the case 24 is in a substantially sealed condition. The first lid portion 26 corresponds to "member" in the practice of this embodiment of the present invention.

The inverter I and converter C (which will be collectively denoted as "power control unit S") configured as described above may give rise to positive (+) static electricity when they are started. The static electricity is considered to occur due to electric actions that take place when energization and de-energization of the IGBTs 7, 8, 11, 12, 13, 14, 15, 16 are repeatedly carried out under control. If the static electricity occurs in this manner, and the power control unit S is electrostatically charged, the response from the time when an accelerating operation is performed to the time when driving force is changed, the output torque of the motor 1, or the response from the time when a braking operation is performed to the time when the braking force produced by the motor 1 is increased, may be reduced. Namely, the running performance may be degraded. This may be because static electricity has influences on the controllability of the power control unit S and its output power.

Therefore, self-discharge-type static eliminators 28 for neutralizing and eliminating positive (+) static electricity are attached to the case 24. The static eliminators 28 give rise to negative ions in outside air through corona discharge, so as to eliminate positive (+) static electricity of the power control unit S. As known in the art, the corona discharge occurs when the potential is high; therefore, it is preferable to attach the self-discharge-type static eliminators 28 to portions where the insulated condition is maintained and the potential is relatively high. Accordingly, in the example shown in FIG. 1, the self-discharge-type static eliminators 28 are attached to an outer surface of a central portion of the first lid portion 26 that has a high potential due to static electricity, and is connected to the vehicle body serving as a ground in an insulated condition or a condition in which electric resistance is large. In FIG. 1, the positions at which the self-discharge-type static eliminators 28 are placed are indicated by black dot "●".

The self-discharge-type static eliminators 28 may be formed from sheets made of a material, such as gold, silver, copper, or aluminum, having high electric conductivity, and are arranged to bring about corona discharges according to the potential of the sheets. Since a corona discharge occurs at a sharp or pointed portion, as known in the art, the sheet is preferably formed in a polygonal shape with sharp edges. Also, an outer circumferential surface of the sheet is preferably formed to provide a jagged cut surface. Further, sharp or pointed projections and recesses are preferably formed on a surface of the sheet by knurling. In the following description, the self-discharge-type static eliminator 28 will be referred to as "sheet 28".

The self-discharge-type static eliminator according to this embodiment of the present invention is not limited to the sheet 28 as described above, but may be formed by coating the first lid portion 26 with a paint having high electric conductivity, or plating the first lid portion 26. Also, the self-discharge-type static eliminator may be formed of a conductive polymer, such as polyaniline, polypyrrole, or polythiophene, or conductive plastic.

Here, actions taken by self-discharging, namely, electrically neutralizing and eliminating positive (+) static electricity that appears on the first lid portion 26, will be described. When the power control unit S is started and electrostatically charged, as described above, a part of static charges are transferred to the first main body portion 25 and the first lid portion 26, via inside air of the case 24. Another part of static charges are taken by the inside air of the case 24 and the power control unit S. Since the static charges transferred to the first main body portion 25 flow through the vehicle body, the potential of the first main body portion 25 is kept at a low level. On the other hand, the first lid portion 26 is kept insulated from the first main body portion 25 and the vehicle body, as described above; therefore, the static charges transferred to the first lid portion 26 are accumulated on the first lid portion 26. If the first lid portion 26 is thus positively and electrostatically charged, corona discharges occur at the sheets 28 according to the potential of the first lid portion 26, and the positive (+) potentials of the sheets 28 and their adjacent portions are lowered. More specifically, negative ions are generated in outside air through the corona discharges, and the positive (+) static charges are neutralized and eliminated by the negative ions. Namely, the positive (+) potential of the charged first lid portion 26 is lowered. The range within which the potential is lowered by the sheet 28 is in the range of about 150 to 200 mm as a diameter of a circle having the sheet 28 at its center.

If the potential of the first lid portion 26 is lowered in this manner, a potential difference between the first lid portion 26 and the inside air of the case 24 is increased, so that static charges are transferred from the inside air to the first lid portion 26, and the positive (+) potential of the inside air is lowered. Also, when the power control unit S is started, the power control unit S generates heat due to electric resistance, etc., and the inside air of the case 24 has a relatively high temperature; as a result, the inside air of the case 24 is supposed to be circulated by convection. Accordingly, the inside air that is in contact with the first lid portion 26 is electrically neutralized, and new inside air that is electrostatically charged afterward flows to the inner surface of the first lid portion 26, to be neutralized. Therefore, the potential of the inside air of the case 24 as a whole is lowered.

With the positive (+) potential of the inside air thus lowered, a potential difference between the inside air and the power control unit S is increased, and static charges are transferred from the power control unit S to the inside air. As a result, the positive (+) potential of the power control unit S is lowered. Namely, static electricity of the power control unit S is reduced or even eliminated.

Since the vehicle body and the road surface are in an insulated condition, as described above, the positive (+) potential of the vehicle body and the first main body portion 25 increases by more than an insubstantial amount. Also, since the first main body portion 25 and the first lid portion 26 are connected to each other with bolts, no small current passes between the first main body portion 25 and the first lid portion 26. Therefore, if the potential of the first lid portion 26 is lowered as described above, a potential difference between the first lid portion 26 and the first main body portion 25 increases, and positive (+) static charges are transferred from the first main body portion 25 to the first lid portion 26. Namely, the positive (+) potential of the first main body portion 25 is lowered. With the potential of the first main body portion 25 thus lowered, positive (+) static charges on the power control unit S connected to the first main body portion 25 are transferred to the first main body portion 25, and the positive (+) potential of the power control unit S is lowered. Namely, static electricity of the power control unit S is reduced or even eliminated.

By attaching the sheets 28 to the first lid portion 26 as described above, it is possible to eliminate positive (+) static electricity of the power control unit S via the inside air of the case 24. Therefore, the controllability, etc. of the power control unit S is less likely or even unlikely to be influenced by static electricity. As a result, the running performance of the vehicle is less likely or even unlikely to be degraded. In particular, the sheets 28 are attached to the central portion of the first lid portion 26, so that static electricity can be removed from a portion of the inside air of the case 24 which is more likely to be circulated by convection; therefore, a greater effect can be yielded. Also, it is possible to lower the potential of the first main body portion 25 via the bolts, by eliminating static electricity of the first lid portion 26. As a result, positive (+) static electricity of the power control unit S connected to the first main body portion 25 can also be reduced or even eliminated. Therefore, the running performance of the vehicle is less likely or even unlikely to be degraded, like the effect as described above.

Figure 2:
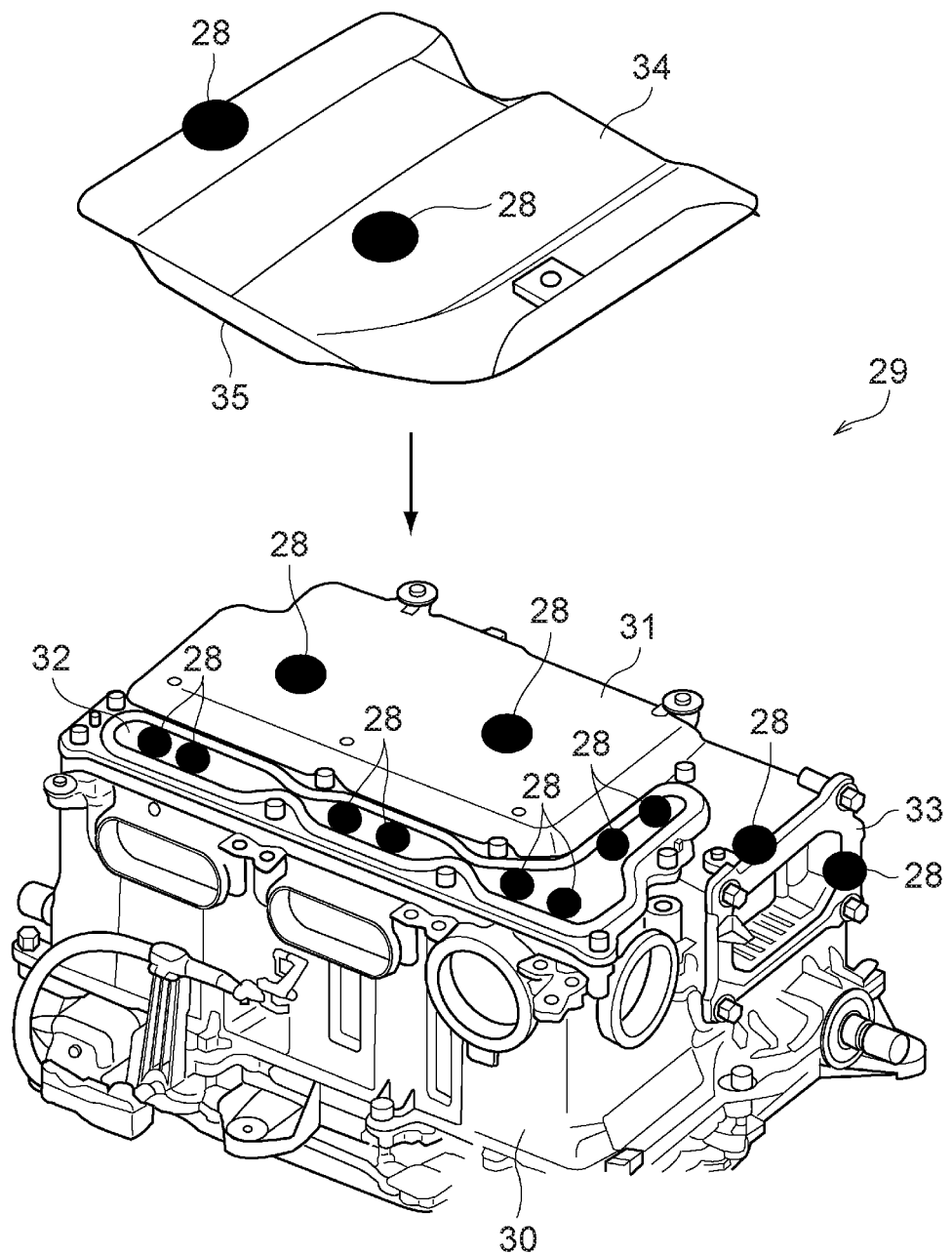
FIG. 2 is a view useful for explaining the arrangement having sheets attached to another case in which an inverter and a converter are housed, in one embodiment of the invention.

FIG. 2 is a view useful for explaining another configuration of a case in which the power control unit S is housed. The case 29 shown in FIG. 2 includes a second main body portion 30 formed similarly to the first main body portion 25 shown in FIG. 1, a second lid portion 31 that is formed of a metallic material and closes a part of an opening of the second main body portion 30, and a third lid portion 32 that is formed of a resin material and closes another part of the opening of the second main body portion 30. The second lid portion 31 is connected to the second main body portion 30 via a seal (not shown), as in the example of FIG. 1. Also, the second main body portion 30 is formed with a connecting portion 33 formed of a resin material for installation of wire harnesses connected to the power supply E and the motor 1, for example. Further, a first cover member 34 formed of a resin material is provided for covering the upper surfaces of the respective lid portions 31, 32, and foamed rubber 35 for absorbing vibration, etc. is attached to the back surface of the first cover member 34.

In the case 29 configured as described above, the third lid portion 32, connecting portion 33 and the first cover member 34, in addition to the second lid portion 31 connected to the second main body portion 30 like the first lid portion 26 shown in FIG. 1, are likely to be electrostatically charged, and are kept insulated from the second main body portion 30. Accordingly, the potentials of these portions 31, 32, 33, 34 are high. The second lid portion 31, third lid portion 32, connecting portion 33, and the first cover member 34 correspond to "members" in the practice of this embodiment of the present invention. Therefore, as in the example shown in FIG. 1, static electricity of the power control unit S can be eliminated by attaching the sheets 28 to the positions indicated by black dot "●" in FIG. 2, for example, and thus neutralizing and eliminating static electricity of the second lid portion 31, third lid portion 32, connecting portion 33, and the first cover member 34. Consequently, the running performance of the vehicle is less likely or even unlikely to be degraded.

Figure 3:
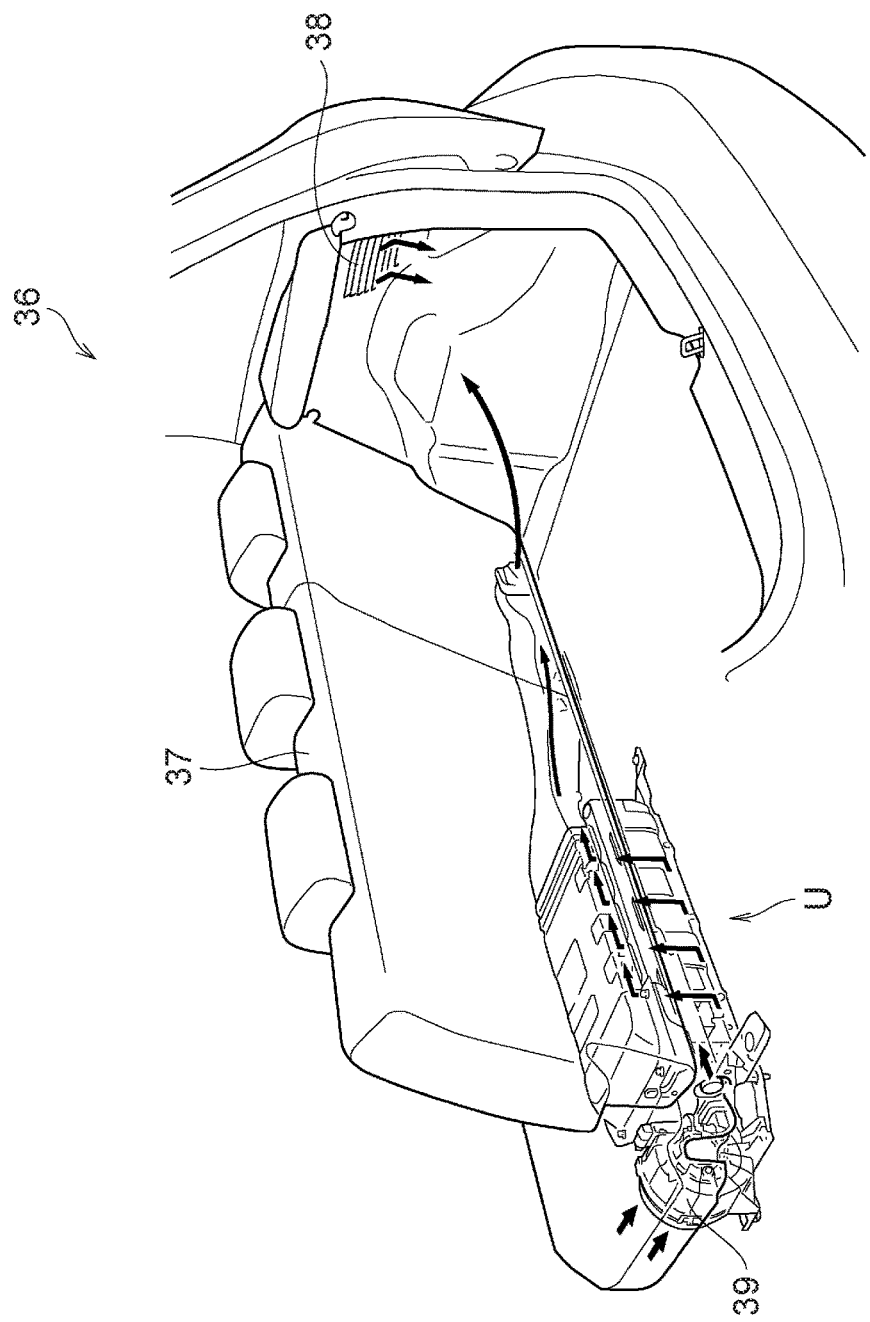
FIG. 3 is a view showing an example in which a Hybrid Vehicle (HV) battery unit is installed on a vehicle, according to one embodiment of the invention.

Next, the arrangement for eliminating static electricity of the battery 2 and the capacitor 3 (which will be collectively denoted as "power supply E") will be described. FIG. 3 shows a condition in which a Hybrid Vehicle (HV) battery unit U having the power supply E in the form of a unit is installed on a vehicle 36. In the vehicle 36, the HV battery unit U is provided below a rear seat 37, and air for cooling the HV battery unit U is taken in from the front side of space under the rear seat 37. After the air flows through the interior of a case which will be described later, the air is discharged through a discharge aperture 38 located on the rear side of the vehicle 36. A cooling blower 39 for forcing the air to flow in this manner is attached to the HV battery unit U.

Figure 4:
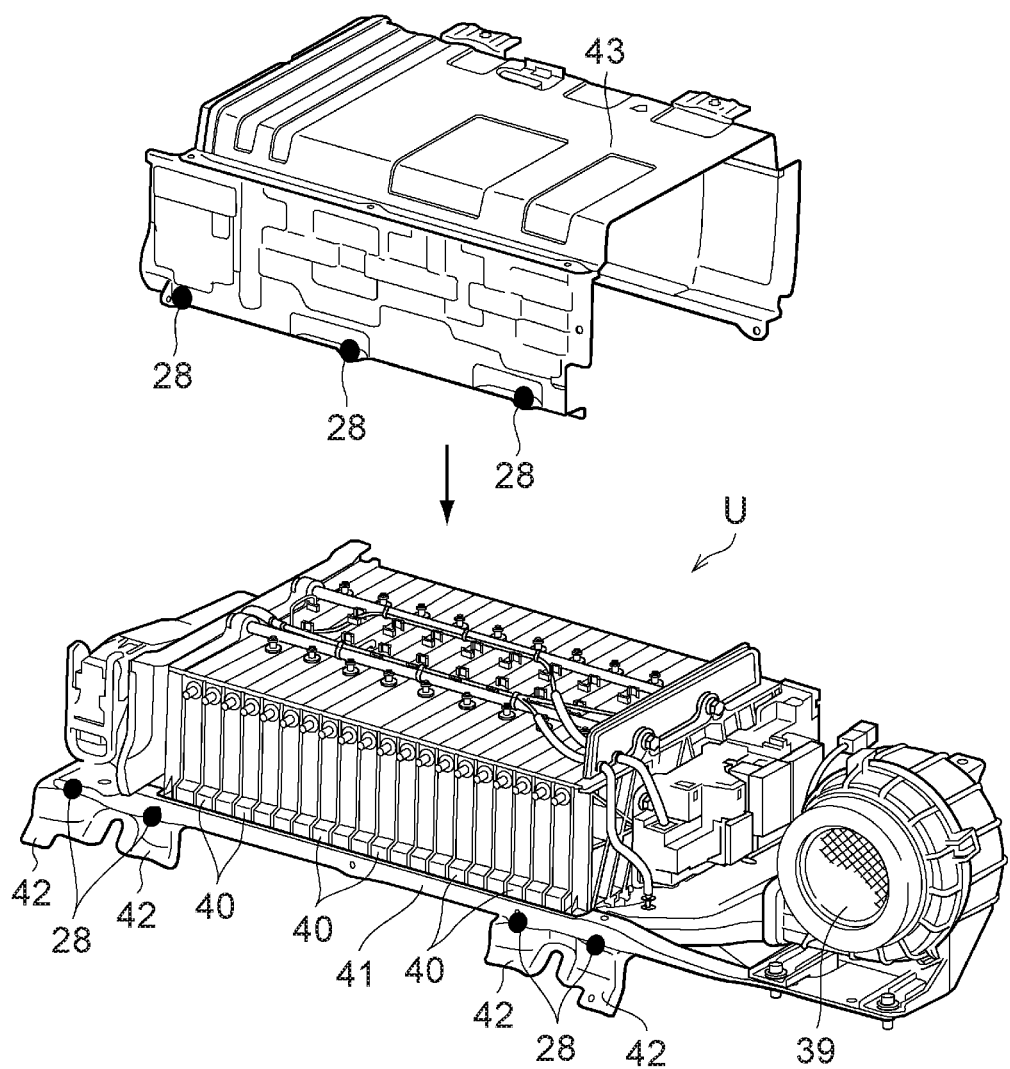
FIG. 4 is a view useful for explaining the arrangement having sheets attached to the HV battery unit of FIG. 3 in the embodiment of the invention.

FIG. 4 is a view useful for explaining the configuration of the HV battery unit U. In the HV battery unit U, a plurality of battery modules 40 individually covered with cubic cases are connected in series. The HV battery unit U and the above-mentioned cooling blower 39 are mounted on a first plate 41 fixed to the vehicle body that is not shown in the figures. The first plate 41 is formed with two or more flanges 42, and the flanges 42 are fixed to the vehicle body with bolts, or the like.

A gutter-shaped second cover member 43 is connected to the first plate 41 so as to surround the HV battery unit U, and air is fed from the cooling blower 39 into space between the inner surface of the second cover member 43 and the HV battery unit U, so that the HV battery unit U is cooled by the air.

The HV battery unit U configured as described above may give rise to static electricity when it operates electrically, such as when the HV battery unit U generates electric power, or is charged with electric power supplied from the motor 1. Also, static electricity may occur due to friction, or the like, caused by driving the cooling blower 39. A part of static charges thus produced are transferred to the second cover member 43 via inside air of the second cover member 43. The static charges transferred to the second cover member 43 are transferred to the vehicle body serving as a ground, via the first plate 41. In the meantime, a connecting portion between the second cover member 43 and the first plate 41, and a connecting portion between the first plate 41 and the vehicle body, have small cross-sectional areas and large electric resistance; therefore, even if a part of static charges flow from the second cover member 43 to the vehicle body via the first plate 41, other static charges may be accumulated on the second cover member 43 and the first plate 41. If the second cover member 43 and the first plate 41 are electrostatically charged, a potential difference between the second cover member 43 or the first plate 41 and the HV battery unit U is reduced, and static charges may not be released from the HV battery unit U, but stay on the HV battery unit U. If the HV battery unit U is thus electrostatically charged, the response from the time when an accelerating operation is performed to the time when driving force is changed, the output torque of the motor 1, or the response from the time when a braking operation is performed to the time when the braking force produced by the motor 1 is increased, may be reduced. Namely, the running performance may be degraded. This may be because static electricity has influences on the output voltage and input voltage of the HV battery unit U. Accordingly, the sheets 28 that serve as the self-discharge-type static eliminators are attached to the portion that connects the second cover member 43 and the first plate 41, and the portion that connects the first plate 41 and the vehicle body. In FIG. 4, the positions at which the sheets 28 are placed are indicated by black dot "●".

Here, actions taken by self-discharging, namely, electrically neutralizing and eliminating positive (+) static electricity on the HV battery unit U, will be described. If static electricity occurs, i.e., static charges appear on the HV battery unit U and the cooling blower 39 when they are driven, as described above, the static charges are transferred to the second cover member 43 via air that flows within the second cover member 43, and a part of the static charges are transferred from the second cover member 43 to the vehicle body via the first plate 41. As described above, the potentials of the electrostatically charged second cover member 43 and the first plate 41 increase, and corona discharges from the sheets 28 take place, whereby negative ions are generated in air (outside air) outside the second cover member 43, and the positive (+) static charges are neutralized and eliminated by the negative ions. Namely, the potentials of the positively charged second cover member 43 and first plate 41 are lowered.

With the potential of the first plate 41 thus lowered, static charges are transferred from the second cover member 43 to the first plate 41, according to a potential difference between the second cover member 43 and the first plate 41. With the potential of the second cover member 43 thus lowered, a potential difference arises between the second cover member 43 and the inside air of the second cover member 43, and static charges are transferred from the inside air to the second cover member 43, so that the positive (+) potential of the inside air is lowered. Since the inside air of the second cover member 43 is forced to flow by means of the cooling blower 39, as described above, the inside air that is in contact with the second cover member 43 is first neutralized, and then the inside air that was electrostatically charged on the upstream side in the direction of air flow flows onto the inner surface of the second cover member 43, to be neutralized. Therefore, the potential of the inside air of the second cover member 43 is lowered.

With the positive (+) potential of the air thus lowered, a potential difference appears between the inside air and the HV battery unit U, and static charges are transferred from the HV battery unit U to the inside air, so that the positive (+) potential of the HV battery unit U is lowered. Namely, static electricity of the HV battery unit U is reduced or even eliminated.

As described above, it is possible to eliminate positive (+) static electricity of the HV battery unit U via the inside air of the second cover member 43, by attaching the sheets 28 to the second cover member 43 and the first plate 41 as described above. Therefore, the controllability, etc, of the HV battery unit U are less likely or even unlikely to be influenced by static electricity. As a result, the running performance of the vehicle is less likely or even unlikely to be degraded. Also, it is possible to curb or prevent transfer of static charges produced by the HV battery unit U to the vehicle body, by attaching the sheets 28 to the connecting portion between the first plate 41 and the vehicle body. Since the road surface and the vehicle body are insulated from each other, with the wheels made of rubber, or the like, interposed therebetween, it is possible to curb an increase of the potential of the vehicle body and resulting variations in the potential of the ground, by curbing transfer of static charges to the vehicle body.

Figure 5:
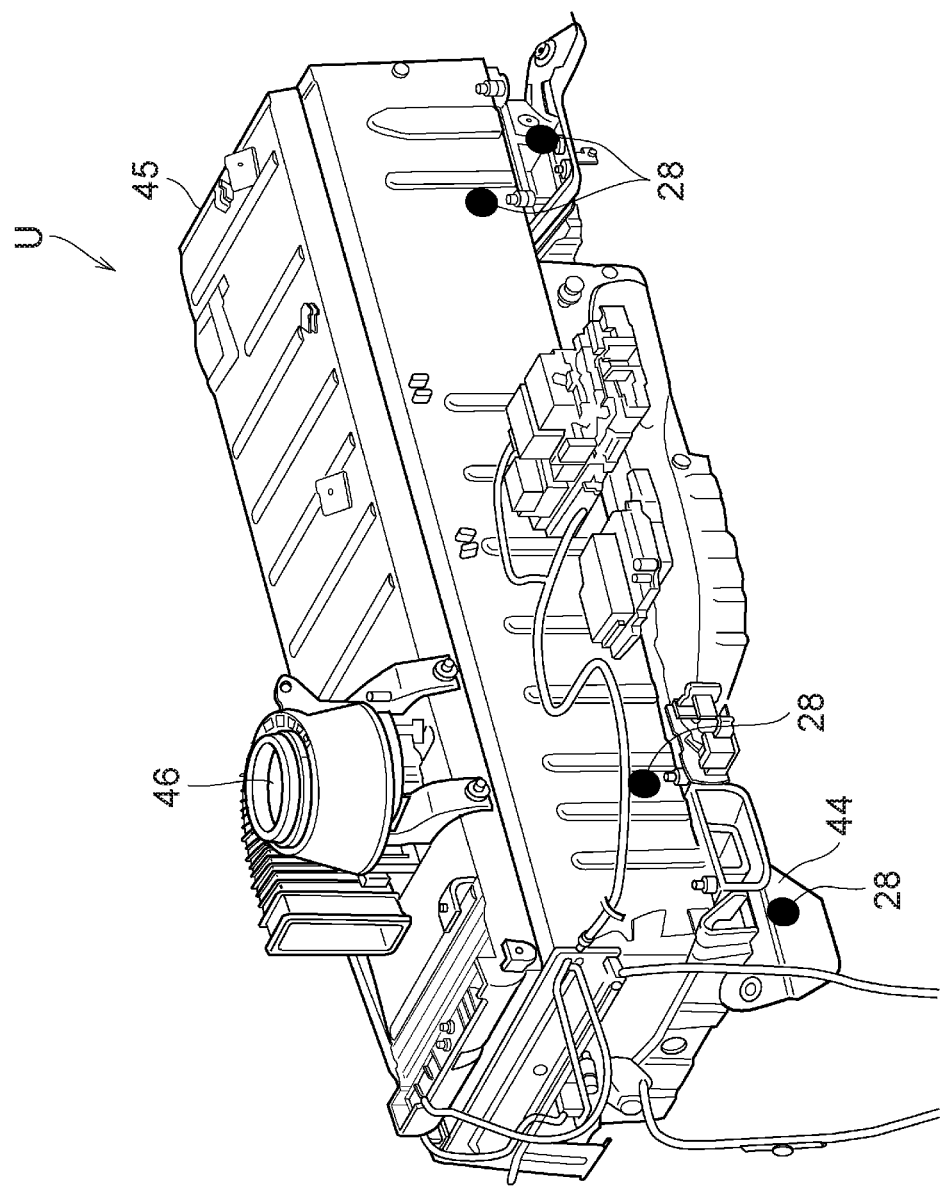
FIG. 5 is a view useful for explaining the arrangement having sheets attached to another HV battery unit in one embodiment of the invention.

FIG. 5 is a view useful for explaining the configuration of an HV battery unit U provided in a trunk or luggage room in a sedan-type vehicle, or the like. The HV battery unit U shown in FIG. 5 is attached to a second plate 44 formed similarly to the first plate 41 shown in FIG. 4, and a third cover member 45 is connected to the second plate 44 so as to surround the HV battery unit U. Also, a cooling blower 46 is mounted on the upper surface of the third cover member 45. The sheets 28 are attached to a connecting portion between the third cover member 45 and the second plate 44, and a connecting portion between the second plate 44 and the vehicle body.

The HV battery unit U configured as described above also yields substantially the same effect as that of the example shown in FIG. 4, since the sheets 28 are attached to the connecting portion between the third cover member 45 and the second plate 44, and the connecting portion between the second plate 44 and the vehicle body, as in the example shown in FIG. 4.

What is claimed is:

1. A vehicle including a vehicle body that is kept insulated from a road surface, comprising:
    a power control unit;
    a drive motor configured to produce torque for running the vehicle when electric power is supplied from the power control unit to the drive motor;
    a case main body in which the power control unit is housed;
    a member that is connected to the case main body; and
    a static eliminator configured to neutralize and eliminate positive charges on the member and to lower a positive potential of the member, by self-discharge for producing negative air ions in air outside the member according to the positive potential of the member that is electrostatically charged,
    wherein the static eliminator is a self-discharge-type static eliminator ionizing the air,
    wherein the static eliminator has electric conductivity,
    wherein the member is a lid configured to close the case main body; and the static eliminator is attached to an outer surface of the lid, and
    the lid is configured to make the case main body in a sealed condition such that air in the case main body circulates by convection, said convection caused by an operation of the power control unit.

2. The vehicle according to claim 1, wherein the member is formed of a resin material.

3. The vehicle according to claim 1, wherein the static eliminator is attached to a central portion of the member.

4. The vehicle according to claim 1, wherein the static eliminator comprises a sheet formed of a material having electric conductivity and wherein the static eliminator is formed of a conductive polymer, such as polyaniline, polypyrrole, or polythiophene, or conductive plastic.

5. The vehicle according to claim 1, wherein the power control unit and the member are arranged such that air flows between an inner surface of the member and the power control unit.

6. The vehicle according to claim 1, wherein the static eliminator is a coat of painting on the lid.

7. The vehicle according to claim 1, wherein the static eliminator is plating on the lid.

8. A vehicle including a vehicle body that is kept insulated from a road surface, comprising:
    a power supply of a drive motor;
    a fixed frame connected to the vehicle body such that the power supply is mounted on the fixed frame;
    a cover member connected to the fixed frame such that the power supply is surrounded by the cover member, wherein said cover member is formed of a resin material;
    a blower configured to force air between the power supply and the cover member; and
    a static eliminator configured to neutralize and eliminate said positive charges on a connecting portion between the fixed frame and the cover member, and to lower a positive potential of the connecting portions, by self-discharge for producing negative air ions in air outside the cover member according to the positive potential of the connecting portions which is electrostatically charged,
    wherein the static eliminator is a self-discharge-type static eliminator ionizing the air, and
    wherein the static eliminator has electric conductivity,
    wherein the static eliminator is provided at a downstream side of the blower in a flowing direction of the air forced to flow.

9. The vehicle according to claim 8, wherein the cover member and the power supply are arranged such that air flows between an inner surface of the cover member and the power supply.

10. The vehicle according to claim 8, wherein the static eliminator comprises a sheet formed of a material having electric conductivity and wherein the static eliminator is formed of a conductive polymer, such as polyaniline, polypyrrole, or polythiophene, or conductive plastic.

* * * * *